United States Patent
Prams (10) Patent No.: US 12,092,678 B2
(45) Date of Patent: Sep. 17, 2024

(54) SENSOR DEVICE FOR A VEHICLE, METHOD FOR PRODUCING A SENSOR DEVICE FOR A VEHICLE, METHOD FOR OPERATING A SENSOR DEVICE FOR A VEHICLE, AND SENSOR SYSTEM FOR A VEHICLE

(71) Applicant: Knorr-Bremse Systeme Fuer Nutzfahrzeuge GmbH, Munich (DE)

(72) Inventor: Stefan Prams, Unterschleissheim (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 19 days.

(21) Appl. No.: 17/594,275

(22) PCT Filed: Mar. 26, 2020

(86) PCT No.: PCT/EP2020/058516
§ 371 (c)(1),
(2) Date: Oct. 8, 2021

(87) PCT Pub. No.: WO2020/212109
PCT Pub. Date: Oct. 22, 2020

(65) Prior Publication Data
US 2022/0170973 A1  Jun. 2, 2022

(30) Foreign Application Priority Data
Apr. 16, 2019 (DE) .................... 10 2019 109 970.6

(51) Int. Cl.
*G01R 29/08* (2006.01)
*G01R 33/00* (2006.01)

(52) U.S. Cl.
CPC ..... *G01R 29/0892* (2013.01); *G01R 29/0878* (2013.01); *G01R 33/0017* (2013.01)

(58) Field of Classification Search
CPC ............ G01R 29/0892; G01R 29/0878; G01R 33/0017; G01B 7/30; G01D 3/036; G01D 5/145
See application file for complete search history.

(56) References Cited

U.S. PATENT DOCUMENTS

| | | | |
|---|---|---|---|
| 2005/0126023 A1 | 6/2005 | Kwon et al. | |
| 2013/0125669 A1 | 5/2013 | Barraco et al. | |

(Continued)

FOREIGN PATENT DOCUMENTS

| | | |
|---|---|---|
| CN | 102822630 A | 12/2012 |
| CN | 106404008 A | 2/2017 |

(Continued)

OTHER PUBLICATIONS

International Search Report for PCT/EP2020/058516 Issued Jul. 15, 2020.

*Primary Examiner* — Alvaro E Fortich
(74) *Attorney, Agent, or Firm* — NORTON ROSE FULBRIGHT US LLP; Gerard A. Messina (57) ABSTRACT

A sensor device for a vehicle, including: at least two magnetic field sensors for detecting a sensing magnetic field from a sensing magnet; in which the magnetic field sensors are configured so that the resultant magnetic field from the sensing magnetic field and an external magnetic interference field from an interference source develops a different strength of effect in different magnetic field sensors. Also described are a related method, control apparatus/unit, sensor system, and computer readable medium.

21 Claims, 3 Drawing Sheets

(56) References Cited

U.S. PATENT DOCUMENTS

| | | | |
|---|---|---|---|
| 2015/0210164 A1* | 7/2015 | Oh ........................ | B60K 37/06 |
| | | | 200/1 R |
| 2015/0309128 A1 | 10/2015 | Raberg | |
| 2016/0041006 A1 | 2/2016 | Ausserlechner | |
| 2016/0245674 A1* | 8/2016 | Ausserlechner ....... | G01D 11/24 |
| 2016/0258781 A1 | 8/2016 | Ausserlechner et al. | |
| 2018/0095145 A1* | 4/2018 | Ausserlechner ....... | G01R 33/07 |
| 2018/0148011 A1 | 5/2018 | Zaugg et al. | |

FOREIGN PATENT DOCUMENTS

| | | | | |
|---|---|---|---|---|
| DE | 102006048771 A1 | | 4/2008 | |
| DE | 102010040584 A1 | | 3/2012 | |
| DE | 102014010601 A1 | | 1/2016 | |
| DE | 102015116303 | * | 3/2017 | ............... G01L 3/10 |
| DE | 102015116303 A1 | | 3/2017 | |
| DE | 102017221991 B3 | | 3/2019 | |
| EP | 3181431 A1 | | 6/2017 | |
| JP | H11125502 A | | 5/1999 | |
| JP | 2012033669 A | | 2/2012 | |

\* cited by examiner

SENSOR DEVICE FOR A VEHICLE, METHOD FOR PRODUCING A SENSOR DEVICE FOR A VEHICLE, METHOD FOR OPERATING A SENSOR DEVICE FOR A VEHICLE, AND SENSOR SYSTEM FOR A VEHICLE

FIELD OF THE INVENTION

The present invention relates to a sensor device for a vehicle, to a method for producing a sensor device for a vehicle, a method for operating a sensor device for a vehicle and to a sensor system for a vehicle, in particular to the field of magnetic field sensors.

BACKGROUND INFORMATION

Existing methods aimed at providing protection against external magnetic fields include, in particular, metallic shields, additional sensors that are used to detect such external magnetic fields, or attempts to cancel out external magnetic fields from a useful signal.

SUMMARY OF THE INVENTION

Against this background, an object of the present invention is to create an improved sensor device for a vehicle, an improved method for producing a sensor device for a vehicle, an improved method for operating a sensor device for a vehicle, and an improved sensor system for a vehicle.

This object may be achieved by a sensor device for a vehicle, a method for producing a sensor device for a vehicle, a method for operating a sensor device for a vehicle, a sensor system for a vehicle and a corresponding computer program according to the independent claims.

According to embodiments, a configuration of a sensor device or a sensor cluster can be implemented in such a way that an external magnetic field acting on the device has different actions on sensors, sensor elements, sensor chips or sensor channels of the device, wherein the effect of the external magnetic field additionally differs from the action of a sensing magnetic field, more precisely, in a systematic or detectable manner. This can also be exploited in a method for calibration and detection when using such a device. This can be achieved even though external magnetic fields act as a so-called common cause effect, and thus a protective effect can also be achieved due to the external magnetic field acting in different ways on a measuring signal and a given ability to differentiate the external magnetic field from a movement of the sensing magnet.

In accordance with some embodiments, it is advantageously possible to ensure protection for magnetic sensor systems against interference effects by external ambient magnetic conditions or external magnetic fields. Such protection is required, for example, by safety standards in the automotive industry, for example ISO 26262, etc. According to the embodiments, therefore, a higher protection against external magnetic fields as well as protection for the population and users of the sensor system can be achieved since the common-cause effect of the external magnetic field can be detected. Sensors, sensor chips or sensor channels which are used for a main sensory function, such as distance measurement, angle measurement, etc., can thus also detect the presence of a magnetic interference field or render it detectable, and communicate implicitly or explicitly via existing channels without the need for additional sensors and channels specifically for this purpose. Protection from a wide range of external magnetic fields in terms of strength and geometric direction as well as at least partial compensation of the effect on a useful signal can also be achieved by back-calculation of the external magnetic field. This advantage is particularly noticeable with regard to applications that require or permit a wide measuring range, since the requirements of an extended measuring range and the requirements of magnetic field protection can be realized in synergy, hence with little effort. Further advantages are the achievement of a higher ASIL class (Automotive Safety Integrity Level) and the operation of a larger range of required integrity levels with the same technology or components, which enables economies of scale and thus cost reduction and streamlining. Compared to shielding entire printed circuit boards, installation space and costs can be saved. Compared to merely weakening the external magnetic field, an increased level of protection can be achieved. This is also possible without the use of expensive components, such as mu-metal, expensive chips with special software, resulting in good component availability and cost savings. Interference effects between a conventional shield and a useful field, or sensing magnetic field of a sensing magnet, can also be avoided, resulting in increased protection and reduced configuration constraints, etc.

A sensor device for a vehicle is presented, wherein the sensor device comprises at least two magnetic field sensors for detecting a sensing magnetic field from a sensing magnet, wherein the magnetic field sensors are configured in such a way that the resultant magnetic field from the sensing magnetic field and an external magnetic interference field from an interference source develops a different size of the effect obtained with respect to signal values in the relevant magnetic field sensors.

The sensor device can comprise the sensing magnets. Each of the magnetic field sensors can comprise at least one measurement transducer. The magnetic field sensors can be located on a common circuit board or on a plurality of circuit boards. A circuit board can be a semiconductor chip.

According to one embodiment, at least one of the magnetic field sensors can comprise a device for shielding at least one component of the sensing magnetic field and, additionally or alternatively, of the magnetic interference field. The shielding device can be configured to attenuate at least one component of the sensing magnetic field and, additionally or alternatively, of the magnetic interference field for the measurement transducer. Such an embodiment offers the advantage that the influence of the magnetic interference field can be easily and reliably detected or rendered detectable.

Also, at least one of the magnetic field sensors can comprise a device for concentrating at least one component of the sensing magnetic field and, additionally or alternatively, of the magnetic interference field. The concentrating device can be configured to concentrate the at least one component of the sensing magnetic field and, additionally or alternatively, of the magnetic interference field, on the measurement transducer. Such an embodiment offers the advantage that magnetic interference effects can be determined reliably and accurately.

In this case, the shielding device and additionally or alternatively the concentrating device, can be configured to influence the sensing magnetic field and the magnetic interference field differently. In addition or alternatively, the shielding device, and additionally or alternatively the concentrating device, can be arranged inside or outside a housing of the sensor device. In addition or alternatively, the shielding device, and additionally or alternatively the concentrating device, may be oriented and additionally or alternatively positioned depending on ambient magnetic conditions. Such an embodiment offers the advantage that the influence of the magnetic interference field can be simply and inexpensively detected or rendered detectable.

In particular, at least one of the magnetic field sensors can comprise the shielding device and the concentrating device. In this case, the devices can have different effects on the magnetic fields. For example, the devices can act differently in different spatial directions of the magnetic fields. Alternatively, at least a first of the magnetic field sensors can comprise the shielding device and at least a second of the magnetic field sensors can comprise the concentrating device. Such an embodiment offers the advantage that, depending on the requirements and constraints on a configuration of the sensor device, suitable and reliable measures can be taken to detect magnetic interference fields.

According to one embodiment, a detection orientation of at least one magnetic field sensor can be rotated relative to a detection orientation of at least one other magnetic field sensor. A detection orientation can refer to an orientation of at least one detection axis, sensing axis, or sensitive axis of the magnetic field sensor. Such an embodiment offers the advantage that a different effect of magnetic fields on the magnetic field sensors can be achieved, allowing costs and components to be saved.

Also, at least one of the magnetic field sensors can comprise a device for at least partially compensating for the magnetic interference field. The device can be configured to execute a compensation algorithm. Such an embodiment offers the advantage that the magnetic interference field can be cancelled out at the sensor itself.

According to one embodiment, each of the magnetic field sensors can be configured for at least two-axis magnetic field sensing. In particular, each of the magnetic field sensors can be configured to determine and output a magnetic angle which is determined from at least two magnetic field components in the respective axial direction. Such an embodiment offers the advantage that the interference field can be determined more accurately.

The vehicle can also be a utility vehicle. In addition or alternatively, the magnetic field sensors can be configured to measure a position of the sensing magnet when a magnetic interference field strength of up to 100 mT, in particular of up to 50 mT or up to 25 mT or millitesla, is present. In addition or alternatively, the magnetic field sensors can be configured to measure a position of the sensing magnet when a magnetic interference field of at least 1.25 mT, in particular of up to 3.75 mT or millitesla, is present. Such an embodiment offers the advantage that even increased environmental conditions for commercial vehicles can be met.

Furthermore, a method for producing a sensor device for a vehicle is presented, the method comprising the following steps:

providing at least two magnetic field sensors for detecting a sensing magnetic field from a sensing magnet; and arranging and, additionally or alternatively, configuring the magnetic field sensors such that the resultant magnetic field from the sensing magnetic field and an external magnetic interference field of an interference source develops a different strength of effect in different magnetic field sensors.

By executing the method an embodiment of the above-mentioned sensor device can be produced.

A method for operating a sensor device for a vehicle is also presented, the method comprising the following steps:

reading in sensor signals from the at least two magnetic field sensors of an embodiment of the above-mentioned sensor device; and evaluating the sensor signals read in the reading-in step, to determine properties of the sensing magnetic field.

The properties of a sensing magnetic field can also be understood to mean a position of the sensing magnet.

The method or the steps of the method can be executed using a control unit.

The approach presented here also creates a control unit that is configured to carry out, control and/or implement the steps of a variant of a method presented here in corresponding devices. This configuration variant of the invention in the form of a control unit also enables the object of the invention to be achieved quickly and efficiently.

For this purpose, the control unit can comprise at least one processing unit for processing signals or data, at least one storage unit for storing signals or data, at least one interface to a sensor or an actuator for reading in sensor signals from the sensor or for outputting data or control signals to the actuator, and/or at least one communication interface for reading in or outputting data that is embedded in a communication protocol. The processing unit can be, for example, a signal processor, a microcontroller or the like, wherein the storage unit can be a flash memory, an EEPROM or a magnetic storage unit. The communication interface can be configured to read in or output data by wireless and/or wired means, wherein a communication interface which can read in or output wired data can read in this data, for example, by electrical or optical means from an appropriate data transmission line or can output this data into an appropriate data transmission line.

A control unit as used here can be understood to mean an electrical device which processes sensor signals and outputs control and/or data signals depending on them. The control unit can comprise an interface, which can be implemented in hardware and/or software. In the case of a hardware-based configuration, the interfaces can be, for example, part of a so-called system ASIC, which includes the whole range of functions of the control unit. It is also possible, however, that the interfaces are dedicated integrated circuits, or at least in part consist of discrete components. In the case of a software-based configuration, the interfaces can be software modules which exist, for example, on a micro-controller in addition to other software modules.

A sensor system for a vehicle is also presented, the sensor system having the following features:

an embodiment of the above-mentioned sensor device; and an embodiment of the above-mentioned control unit, wherein the control unit is connected to the sensor device such that it is capable of signal transmission.

Also advantageous is a computer program product or computer program with program code which can be stored on a machine-readable medium or storage medium, such as a semiconductor memory, a hard drive or an optical storage device and is used to carry out, implement and/or control the steps of the method according to any one of the embodiments described above, in particular when the program product or program is executed on a computer or a device.

Different embodiments may include, in particular, an arrangement of magnetic field sensors and, where appropriate, other elements with magnetic properties in a sensor cluster with more than one sensor or sensor chip, sensory hardware element or sensory channel, in particular those sensors or sensor clusters which are used for implementing safety-critical applications. In addition, embodiments also comprise technical implementation methods to achieve the described object.

Examples of the approach presented here are explained in more detail in the following description with reference to the figures.

DETAILED DESCRIPTION

Figure 1:
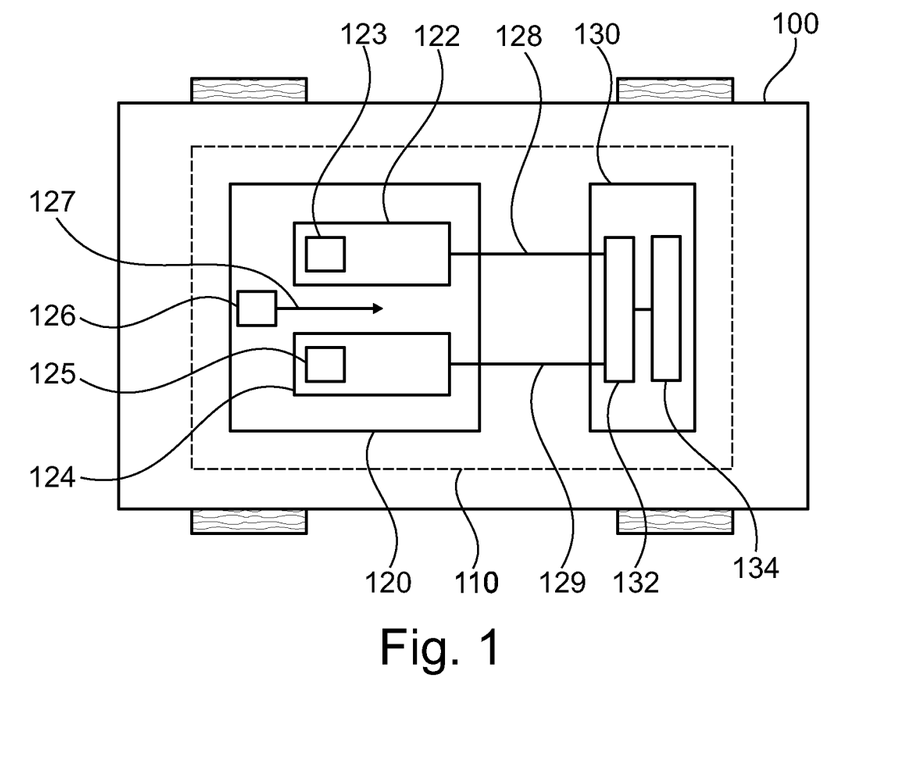
FIG. 1 shows a schematic illustration of a vehicle with a sensor system in accordance with one exemplary embodiment.

FIG. 1 shows a schematic illustration of a vehicle 100 having a sensor system 110 in accordance with one exemplary embodiment. The sensor system 110 comprises a sensor device 120 and a control unit 130.

The sensor device 120 comprises at least two magnetic field sensors 122 and 124. A first magnetic field sensor 122 comprises a first measurement transducer 123 or measurement value transducer 123. A second magnetic field sensor 124 comprises a second measurement transducer 125 or measurement value transducer 125. According to the exemplary embodiment shown here, the sensor device 120 also comprises a sensing magnet 126 which generates a sensing magnetic field 127. Each of the magnetic field sensors 122 and 124 is configured to detect the sensing magnetic field 127 of the sensing magnet 126.

The magnetic field sensors 122 and 124 are configured in such a way that the sensing magnetic field 127 and an external magnetic interference field from an interference source act differently on the measurement transducers 123 and 125 of the magnetic field sensors 122 and 124. The first magnetic field sensor 122 is configured to provide a first sensor signal 128. The second magnetic field sensor 124 is configured to provide a second sensor signal 129.

The control unit 130 is connected to the sensor device 120 such that it is capable of signal transmission. The control unit 130 is configured to operate the sensor device 120. For this purpose, the control unit 130 comprises a reading device 132 and an evaluation device 134. The reading device 132 is configured to read in the sensor signals 128 and 129 from the magnetic field sensors 122 and 124 of the sensor device 120. The evaluation device 134 is configured to evaluate the sensor signals 128 and 129 read in using the reading device 132 in order to determine the sensing magnetic field 127. The control unit 130 in this case is configured to execute the method described in reference to FIG. 7.

According to one exemplary embodiment, the vehicle 100 is a utility vehicle, such as a truck or similar. The magnetic field sensors 122 and 124 are configured for magnetic field strengths of the magnetic interference field, wherein the measurement of the sensing magnetic field can be used for detecting the sensing magnetic position.

Figure 2:
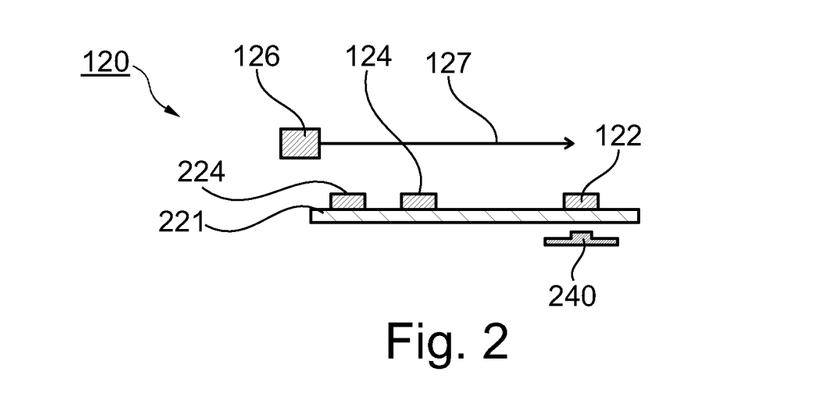
FIG. 2 shows a schematic illustration of a sensor device in accordance with one exemplary embodiment.

FIG. 2 shows a schematic illustration of a sensing device 120 in accordance with an exemplary embodiment. The sensor device 120 is the same as or similar to the sensor device from FIG. 1. Here, the sensor device 120 is shown in a side view. The sensor device 120 according to the exemplary embodiment shown here comprises a first magnetic field sensor 122, a second magnetic field sensor 124 and a third magnetic field sensor 224, which are arranged on a circuit board 221 or a chip or sensor chip 221. The magnetic field sensors 122, 124 and 224 in this case are arranged on a first of two main surfaces of the circuit board 221. The sensor device 120 also comprises a sensing magnet 126 which generates a sensing magnetic field 127. The sensing magnet 126 is arranged adjacent to the magnetic field sensors 122, 124 and 224. In addition, the first magnetic field sensor 122 comprises a device 240 for shielding and/or concentrating at least one component of the sensing magnetic field 127 and/or an external magnetic interference field. The shielding and/or concentrating device 240 is arranged on a second of the two main surfaces of the circuit board 221. Thus, the circuit board 221 is arranged between the magnetic field sensors 122, 124 and 224, in particular the first magnetic field sensor 122, and the shielding and/or concentrating device 240.

The shielding and/or concentrating device 240 is configured in accordance with an exemplary embodiment to influence the sensing magnetic field 127 and the external magnetic interference field in different ways. In addition, according to one exemplary embodiment the shielding and/or concentrating device 240 is oriented and/or positioned depending on ambient magnetic conditions in an environment of the sensor device 120. Even if it is not explicitly shown in FIG. 2, the sensor device 120 can also comprise a housing. In this case, the shielding and/or concentrating device 240 can be arranged inside or outside the housing. According to an exemplary embodiment, the second magnetic field sensor 124 and/or the third magnetic field sensor 224 can also comprise an additional shielding and/or concentrating device 240.

According to one exemplary embodiment, one or at least one of the magnetic field sensors 122, 124 and 224, for example the first magnetic field sensor 122, comprises a shielding and concentrating device 240. Alternatively, one or at least one of the magnetic field sensors 122, 124 and 224, for example the first magnetic field sensor 122, can comprise a screening device and a concentrating device, wherein the devices act differently on the magnetic fields. Alternatively, at least a first of the magnetic field sensors 122, 124 und 224 can comprise a shielding device and at least a second of the magnetic field sensors 122, 124 und 224 can comprise a concentrating device.

In other words, in order to achieve the state in which the magnetic field sensors 122, 124 and 224 are configured in such a way that the sensing magnetic field 127 and an external magnetic interference field from an interference source act on the measuring sensors of the magnetic field sensors 122, 124 and 224 in different ways, the following possibilities are available, among others.

Use of a screen or shield as a magnetic manipulator or device 140, which produces an attenuation of at least one component of the external interference magnetic field targeted at the location of at least one magnetic field sensor 122, 124 or 224. The nature of the attenuation is different, in particular in its direction and/or total field strength, in relation to whether it is an external magnetic interference field or the sensing magnetic field 127 of the sensing magnet 126, which is modified by the movement of the sensing magnet 126, for example. The shield can be mounted inside or outside a sensor (cluster) housing. In addition, such a device 140 can be implemented by targeted mounting, for example with regard to angle, location, etc., of the magnetic field sensor 122, 124 or 224 with respect to the magnetic environment, e.g. metallic parts in the environment of the sensor device 120.

Use of a magnetic concentrator as a manipulator or device 140, which generates a concentration of at least one component of the sensing magnetic field 127 and/or the external magnetic interference field targeted at the location of at least one magnetic field sensor 122, 124 or 224. The nature of the concentration in this case is different, in particular in its direction and/or total field strength, in relation to whether it is an external magnetic interference field or the sensing magnetic field 127 of the sensing magnet 126, which is modified by the movement of the sensing magnet 126, for example. The concentrator can be mounted inside or outside a sensor (cluster) housing. In addition, such a device 140 can be implemented by targeted mounting, for example with regard to angle, location, etc., of the magnetic field sensor 122, 124 or 224 with respect to the magnetic environment, e.g. metallic parts in the environment of the sensor device 120.

Combinations of shield and concentrator, wherein the effect on the sensing magnetic field 127 is different compared to the effect on the external magnetic interference field at the same location. The sensing magnetic field 127 can be strengthened and the external magnetic interference field attenuated, or vice versa. Both magnetic fields may also have an attenuation or an amplification which differs in strength. This can be achieved by a geometric arrangement of the shield and the concentrator. This works when the sensing magnetic field and the magnetic interference field do not have exactly the same direction vector.

Combinations of shield and concentrator, wherein the combination affects the signal values differently with respect to different magnetic field sensors 122, 124 or 224 (i.e., in different locations). For example, the magnetic field sensor 122, 124 or 224 can experience a magnetic field that has changed in a first manner, while the other magnetic field sensors experience a magnetic field that has changed in a second manner, or has not changed.

Figure 3:
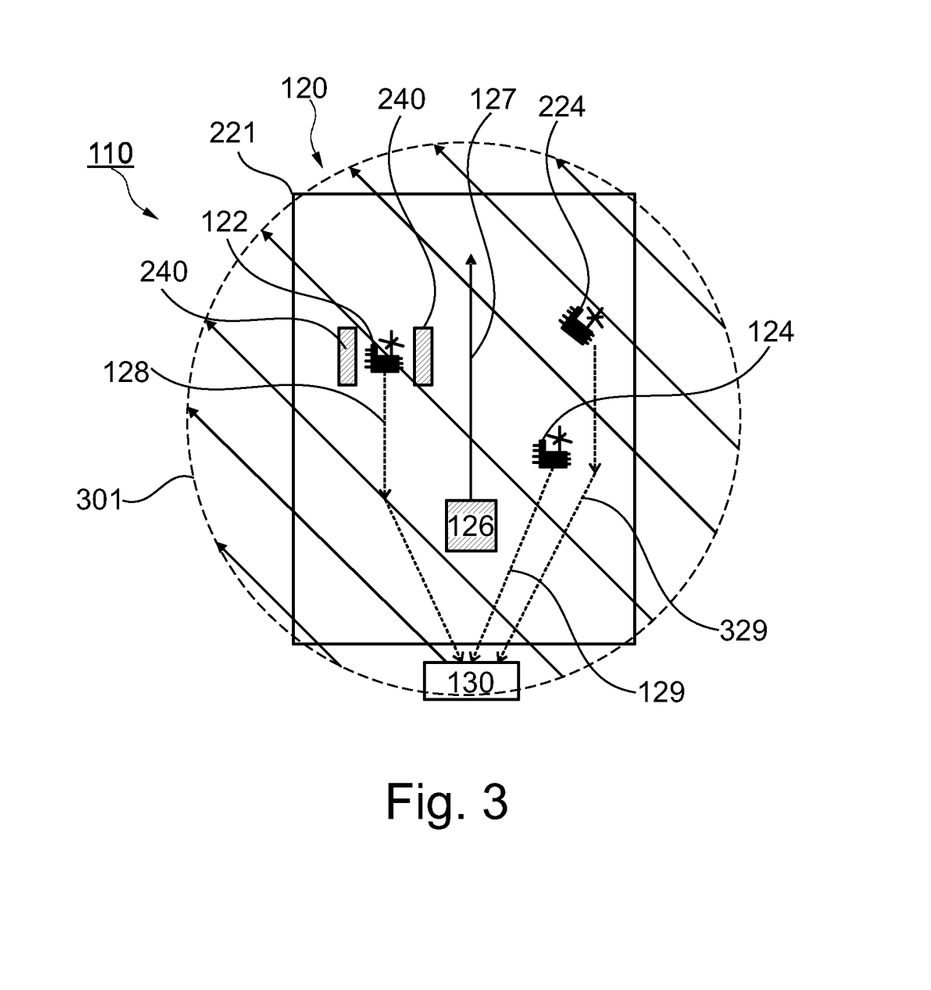
FIG. 3 shows a schematic illustration of a sensor system in accordance with one exemplary embodiment.

FIG. 3 shows a schematic illustration of a sensor system 110 in accordance with an exemplary embodiment. The sensor system 110 is the same as or similar to the sensor system from FIG. 1. The sensor system 110 is shown in a plan view. The parts of the sensor system 110 shown are the sensor device 120, which is the same as or similar to the sensor device from one of the figures described above, and the control unit 130, which comprises a logic, for example a comparator, etc. Furthermore, in the illustration of FIG. 3 an external magnetic interference field 301 from an interference source, or the projection of this magnetic field into the 2D drawing plane or the component of an external magnetic field located in the drawing plane, is schematically illustrated.

The sensor device 120 according to the exemplary embodiment shown here comprises a first magnetic field sensor 122, a second magnetic field sensor 124 and a third magnetic field sensor 224, which are arranged on a circuit board 221 or a chip or sensor chip 221. The sensor device 120 also comprises a sensing magnet 126 which generates a sensing magnetic field 127. The sensing magnet 126 is arranged adjacent to the magnetic field sensors 122, 124 and 224. In addition, the first magnetic field sensor 122 comprises a device 240 for shielding and/or concentrating at least one component of the sensing magnetic field 127 and/or the external magnetic interference field 301. Thus the sensor device 120 corresponds to the sensor device of FIG. 2, with the exception that in the illustration in FIG. 3 it is apparent that the third magnetic field sensor 224 is arranged in a rotated position with respect to the other magnetic field sensors 122 and 124. Here, a detection orientation of the third magnetic field sensor 224 is rotated relative to the detection orientations of the first magnetic field sensor 122 and the second magnetic field sensor 124.

In other words, the state in which the magnetic field sensors 122, 124 and 224 are configured such that the sensing magnetic field 127 and the external magnetic interference field 301 act differently on the measurement transducers of the magnetic field sensors 122, 124 and 224 is also achieved by rotating the orientation of at least one magnetic field sensor, in this case the third magnetic field sensor 224, relative to the other magnetic field sensors, in this case the magnetic field sensors 122 and 124. Here, sensitive axes of the magnetic field sensors 122, 124 and 224 are oriented in such a way that the effect is different depending on whether it is acting on the external magnetic interference field 301 or the sensing magnetic field 127 of the sensing magnet 126, which is altered by the movement of the sensing magnet 126, for example.

In the illustration of FIG. 3, the first sensor signal 128 and the second sensor signal 129 as in FIG. 1, as well as a third sensor signal 329 are also symbolically indicated, wherein the third sensor signal 329 is transmitted between the third magnetic field sensor 224 and the control unit 130.

Figure 4:
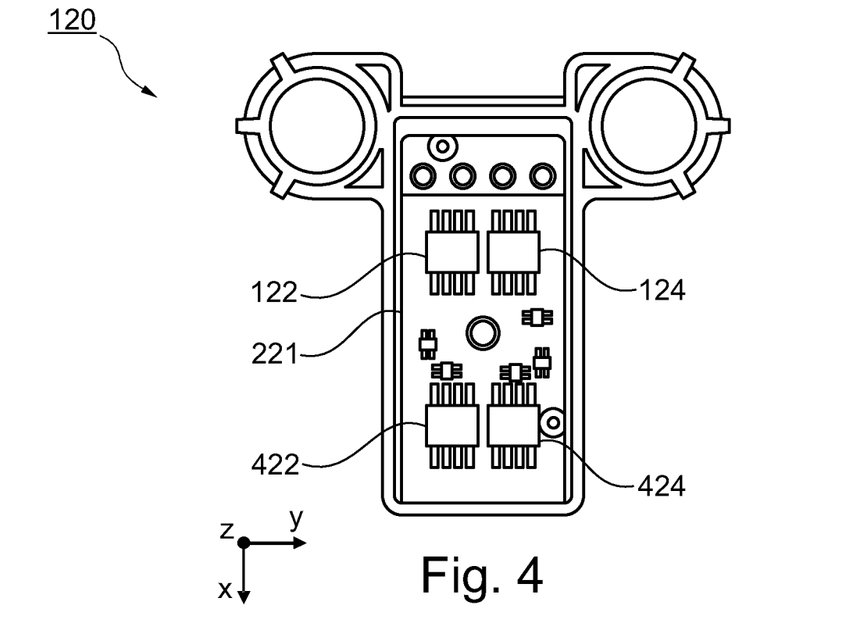
FIG. 4 shows a schematic illustration of a sensor device in accordance with one exemplary embodiment.

FIG. 4 shows a schematic illustration of a sensor device 120 in accordance with an exemplary embodiment. In the example shown in FIG. 4, the approach presented here is not implemented in a directly visible form, compared to the rotated implementation of the sensor cascade 2, as shown in more detail in the following figure. The sensor device 120 is the same as or similar to the sensor device from one of the figures described above. The parts of the sensor device 120 shown in the diagram of FIG. 4 are the printed circuit board 221, the first magnetic field sensor 122, the second magnetic field sensor 124, a further first magnetic field sensor 422 and a further second magnetic field sensor 424. More precisely, the sensor device 120 in FIG. 4 corresponds to the sensor device from FIG. 1, with the exception that the additional first magnetic field sensor 422 and the additional second magnetic field sensor 424 are provided. The additional first magnetic field sensor 422 and the additional second magnetic field sensor 424 are used to extend the measuring range of the sensor device 120. In addition, FIG. 4 shows a three-axis XYZ reference coordinate system. According to the exemplary embodiment shown here, the detection orientations of the magnetic field sensors 122, 124, 422 and 424 are the same or identical in an XY plane of the XYZ reference coordinate system. In the diagram of FIG. 4, an interconnection of the components 124 and 412 has been selected which allows the measuring range to be to extended, or can be used the other way round.

Figure 5:
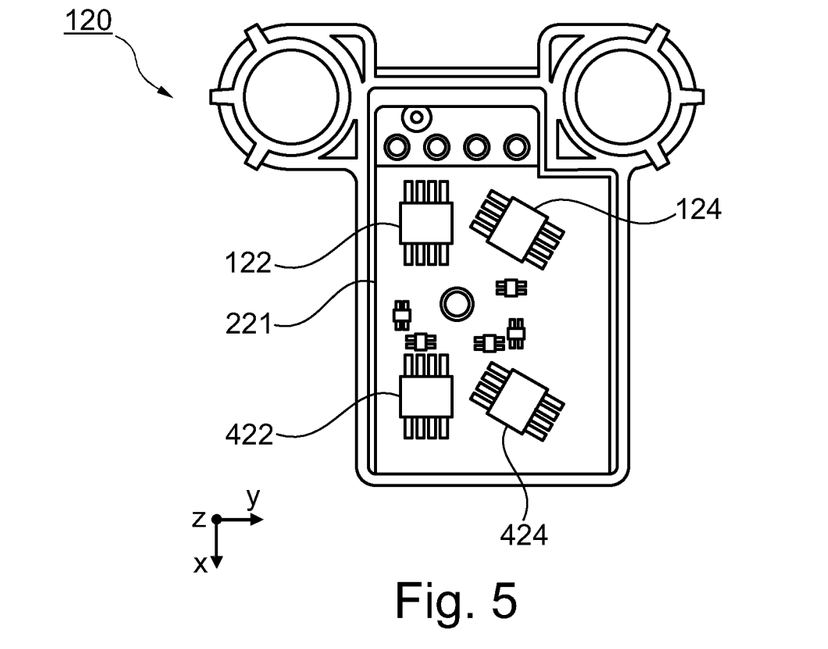
FIG. 5 shows a schematic illustration of a sensor device in accordance with one exemplary embodiment.

FIG. 5 shows a schematic illustration of a sensor device 120 in accordance with an exemplary embodiment. The sensor device 120 in FIG. 5 corresponds here to the sensor device of FIG. 4, with the exception that the second magnetic field sensor 124 and the additional second magnetic field sensor 424 are rotated relative to the first magnetic field sensor 122 and the additional first magnetic field sensor 422 in the XY plane of the XYZ reference coordinate system. More precisely, the detection orientations of the second magnetic field sensor 124 and the additional second magnetic field sensor 424 are rotated relative to the first magnetic field sensor 122 and the additional first magnetic field sensor 422 in the XY plane of the XYZ reference coordinate system.

With reference to the figures described above, it should be noted that according to one exemplary embodiment, at least one of the magnetic field sensors 122, 124 or 122, 124, 224 or 122, 124, 422, 424 can comprise a device for at least partially compensating for the magnetic interference field 301. In other words, at least one of the magnetic field sensors 122, 124 or 122, 124, 224 or 122, 124, 422, 424 can comprise mechanisms, e.g. algorithms, etc., for compensating or partially compensating for the external magnetic fields 301. Even if the compensation effect of the at least one of the magnetic field sensors 122, 124 or 122, 124, 224 or 122, 124, 422, 424 only acts partially or only in limited ranges of the magnetic field strength, a usable influence on the plane of the sensor device 120 or of the sensor system 110 is nevertheless produced.

It should also be noted, with reference to the figures described above, that each of the magnetic field sensors 122, 124 or 122, 124, 224 or 122, 124, 422, 424 can be configured for at least two-axis magnetic field sensing. Each of the magnetic field sensors 122, 124 or 122, 124, 224 or 122, 124, 422, 424 can be configured to determine and output a magnetic angle determined from at least two magnetic field components in the respective axial direction.

A further aspect can also be taken into account for a more compact configuration. For example, two properties describe the different types of influence on the channels. In one exemplary embodiment, a configuration may be provided such that in the range of the (more widespread requirements) with regard to homogeneous magnetic interference fields of low to moderate strength 0 to 1000 or 0 to 3000 Nm, no deviation occurs (or only a small value/below the limit of the comparator). Thus, these fields cannot be detected (or only in a comparatively small range of solid angles). In one exemplary embodiment, a configuration may be provided such that these small to moderate fields only result in a tolerably small value error in the signal.

Both can be considered an important aspect of the system stability in order to be tolerant to fields, the effect of which is sufficiently small not to risk violating the requirements for the maximum permissible error in the signal value. This requires a partial co-directionality of the effects, or limitation of the non-co-directionality.

Furthermore, a configuration can be such that the signal error (at least in parts of the solid angle range of the external magnetic interference field and the positions of the sensing magnet, ideally under any angle and any position) would be reduced. Thus, the part of the error in the same direction increases more slowly than the measured values (mm) of the two sensors/channels diverge. This requires a minimum influence of the measures (i.e. the effect of the shielding or the concentrator) or methods, or a minimum angle between the sensors etc.

Figure 6:
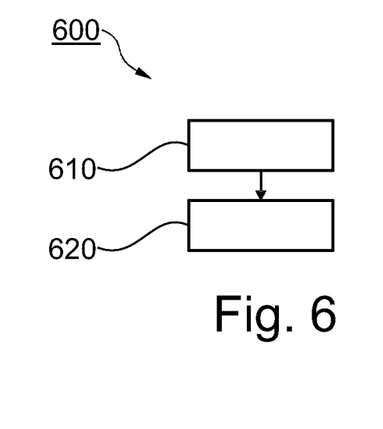
FIG. 6 shows a flow chart of a method for producing in accordance with one exemplary embodiment.

FIG. 6 shows a flow diagram of a method 600 for producing in accordance with an exemplary embodiment. The method 600 for producing can be executed in order to produce a sensor device for a vehicle. In this case, the method 600 for producing can be executed to produce the sensor device from one of the figures described above or a similar sensor device.

The method 600 for producing comprises a providing step 610 and an arranging and/or implementing step 620. In the providing step 610, at least two magnetic field sensors are provided for detecting a sensing magnetic field from a sensing magnet. In the arranging and/or implementing step 620, the magnetic field sensors are arranged and/or implemented in such a way that the resulting magnetic field from the sensing magnetic field and an external magnetic interference field from an interference source develops a different strength of effect in different magnetic field sensors.

Figure 7:
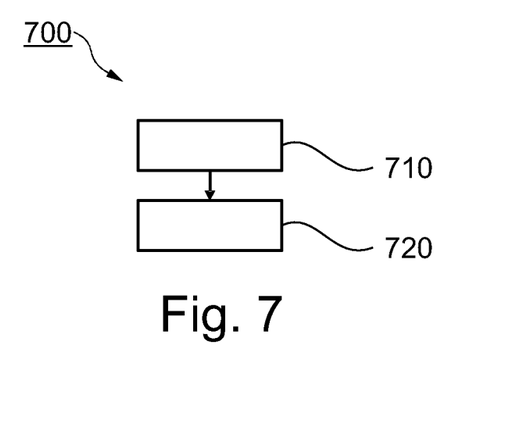
FIG. 7 shows a flow chart of a method for operating in accordance with one exemplary embodiment.

FIG. 7 shows a flow diagram of a method 700 for operating in accordance with an exemplary embodiment. The method 700 for operating can be executed to operate a sensor device for a vehicle. In this case the method 700 for operating can be executed in conjunction with the sensor device from one of the figures described above or a similar sensor device. In this case, the method 700 for operating can be executed using the control unit from one of the figures described above or a similar control unit.

The method 700 for operating comprises a reading-in step 710 and an evaluating step 720. In the reading-in step 710, sensor signals are read in from the at least two magnetic field sensors of the sensor device. In the evaluating step 720, the sensor signals read in during the reading-in step 710 are evaluated in order to determine the properties of the sensing magnetic field.

THE LIST OF REFERENCE SIGNS IS AS FOLLOWS 100 vehicle
110 sensor system
120 sensor device
122 first magnetic field sensor
123 first measurement transducer or measurement value transducer
124 second magnetic field sensor
125 second measurement transducer or measurement value transducer
126 sensing magnet
127 sensing magnetic field
128 first sensor signal
129 second sensor signal
130 control unit
132 reader device
134 evaluation device
221 printed circuit board or (sensor) chip
224 third magnetic field sensor
240 shielding and/or concentrating device
301 external magnetic interference field
329 third sensor signal
422 additional first magnetic field sensor
424 additional second magnetic field sensor
600 method for producing
610 providing step
620 arranging and/or implementing step
700 method for operating
710 reading-in step
720 evaluating step

The invention claimed is:
1. A sensor device for a vehicle, comprising:
at least two magnetic field sensors for detecting a sensing magnetic field from a sensing magnet;

wherein the at least two magnetic field sensors are configured so that a resultant magnetic field from the sensing magnetic field and an interference magnetic field from an interference source develops a different strength of effect in different ones of the at least two magnetic field sensors, and wherein at least one of the magnetic field sensors includes a shielding device for shielding at least one component of the sensing magnetic field and/or the interference magnetic field, and/or wherein at least one of the magnetic field sensors includes a concentrating device for concentrating at least one component of the sensing magnetic field and/or the interference magnetic field, wherein the shielding device and/or the concentrating device is arranged within a housing of the sensor device, and wherein the sensor device is configured to detect a size of a deviation between the sensing magnetic field and the magnetic interference field so that a comparator threshold is not exceeded.

2. The sensor device of claim 1, wherein at least one of the magnetic field sensors includes the shielding device for shielding at least one component of the sensing magnetic field and/or the magnetic interference field and/or at least one of the magnetic field sensors includes the concentrating device for concentrating at least one component of the sensing magnetic field and/or the interference magnetic field.

3. The sensor device of claim 2, wherein the device is configured to influence the sensing magnetic field and the magnetic interference field in different ways, and/or the device is arranged inside or outside the housing of the sensor device and/or the device is oriented and/or positioned depending on ambient magnetic conditions.

4. The sensor device of claim 2, wherein at least one of the magnetic field sensors includes the shielding device and the concentrating device, wherein the devices act on the magnetic fields in different ways, or that at least a first of the magnetic field sensors includes the shielding device and at least a second of the magnetic field sensors includes the concentrating device.

5. The sensor device of claim 1, wherein a detection orientation of at least one magnetic field sensor is rotated relative to at least one detection orientation of at least one other magnetic field sensor and/or that at least one of the magnetic field sensors includes a device for at least partially compensating for the magnetic interference field.

6. A sensor device for a vehicle, comprising:
at least two magnetic field sensors for detecting a sensing magnetic field from a sensing magnet;
wherein the at least two magnetic field sensors are configured so that a resultant magnetic field from the sensing magnetic field and an interference magnetic field from an interference source develops a different strength of effect in different ones of the at least two magnetic field sensors, and
wherein the sensor device is configured to detect a size of a deviation between the sensing magnetic field and the magnetic interference field so that a comparator threshold is not exceeded.

7. A sensor device for a vehicle, comprising:
at least two magnetic field sensors for detecting a sensing magnetic field from a sensing magnet;
wherein at least one of the magnetic field sensors includes a shielding device for shielding at least one component of the sensing magnetic field and/or the interference magnetic field, and/or wherein at least one of the magnetic field sensors includes a concentrating device for concentrating at least one component of the sensing magnetic field and/or the interference magnetic field,
wherein the shielding device and/or the concentrating device is arranged within a housing of the sensor device, and
wherein at least in portions of a solid angle range that the interference magnetic field occupies, a non-co-directional component of a signal error is greater than a co-directional component of the signal error, wherein the signal error represents a difference in a signal from one of the at least two magnetic field sensors between an absence of the interference magnetic field and a presence of the interference magnetic field.

8. The sensor device of claim 1, wherein each of the magnetic field sensors is configured for at least two-axis magnetic field sensing, and wherein each of the at least two magnetic field sensors is configured to determine and output a magnetic angle determined from at least two magnetic field components in the respective axial direction.

9. The sensor device of claim 1, wherein the vehicle is a utility vehicle and the at least two magnetic field sensors are configured for measuring a position of a sensing magnet when a magnetic interference field of up to 100 millitesla is present.

10. A method for producing a sensor device for a vehicle, the method comprising:
providing at least two magnetic field sensors for detecting a sensing magnetic field from a sensing magnet; and
arranging and/or implementing the at least two magnetic field sensors so that a resultant magnetic field from the sensing magnetic field and an interference magnetic field of an interference source develops a different strength of effect in different ones of the at least two magnetic field sensors, and
wherein at least one of the magnetic field sensors includes a shielding device for shielding at least one component of the sensing magnetic field and/or the interference magnetic field, and/or wherein at least one of the magnetic field sensors includes a concentrating device for concentrating at least one component of the sensing magnetic field and/or the interference magnetic field,
wherein the shielding device and/or the concentrating device is arranged within a housing of the sensor device, and
wherein the sensor device is configured to detect a size of a deviation between the sensing magnetic field and the magnetic interference field so that a comparator threshold is not exceeded.

11. A method for operating a sensor device for a vehicle, the method comprising:
reading in sensor signals from the at least two magnetic field sensors of the sensor device, wherein the sensor device includes:
at least two magnetic field sensors for detecting a sensing magnetic field from a sensing magnet;
wherein the at least two magnetic field sensors are configured so that a resultant magnetic field from the sensing magnetic field and an interference magnetic field from an interference source develops a different strength of effect in different ones of the at least two magnetic field sensors, and
wherein at least one of the magnetic field sensors includes a shielding device for shielding at least one component of the sensing magnetic field and/or the interference magnetic field, and/or wherein at least one of the magnetic field sensors includes a concentrating device for concentrating at least one component of the sensing magnetic field and/or the interference magnetic field, wherein the shielding device and/or the concentrating device is arranged within a housing of the sensor device, and wherein the sensor device is configured to detect a size of a deviation between the sensing magnetic field and the magnetic interference field so that a comparator threshold is not exceeded; and evaluating the sensor signals read in during the reading-in to determine properties of the sensing magnetic field.

12. A control apparatus for operating a sensor device for a vehicle, comprising:
a control unit configured to perform the following:
reading in sensor signals from the at least two magnetic field sensors of the sensor device, wherein the sensor device includes:
at least two magnetic field sensors for detecting a sensing magnetic field from a sensing magnet, wherein the at least two magnetic field sensors are configured so that a resultant magnetic field from the sensing magnetic field and an e interference magnetic field from an interference source develops a different strength of effect in different ones of the at least two magnetic field sensors;
wherein at least one of the magnetic field sensors includes a shielding device for shielding at least one component of the sensing magnetic field and/or the interference magnetic field, and/or wherein at least one of the magnetic field sensors includes a concentrating device for concentrating at least one component of the sensing magnetic field and/or the interference magnetic field, and
wherein the shielding device and/or the concentrating device is arranged within a housing of the sensor device, and
wherein the sensor device is configured to detect a size of a deviation between the sensing magnetic field and the magnetic interference field so that a comparator threshold is not exceeded; and
evaluating the sensor signals read in during the reading-in to determine properties of the sensing magnetic field.

13. A sensor system for a vehicle, comprising:
a sensor device, wherein the sensor device includes:
at least two magnetic field sensors for detecting a sensing magnetic field from a sensing magnet, wherein the at least two magnetic field sensors are configured so that a resultant magnetic field from the sensing magnetic field and an interference magnetic field from an interference source develops a different strength of effect in different ones of the at least two magnetic field sensors;
wherein at least one of the magnetic field sensors includes a shielding device for shielding at least one component of the sensing magnetic field and/or the interference magnetic field, and/or wherein at least one of the magnetic field sensors includes a concentrating device for concentrating at least one component of the sensing magnetic field and/or the interference magnetic field,
wherein the shielding device and/or the concentrating device is arranged within a housing of the sensor device, and
wherein the sensor device is configured to detect a size of a deviation between the sensing magnetic field and the magnetic interference field so that a comparator threshold is not exceeded; and
a control unit, wherein the control unit is connected to the sensor device so that it is capable of signal transmission, and wherein the control unit is configured to perform the following:
reading in sensor signals from the at least two magnetic field sensors of the sensor device; and
evaluating the sensor signals read in during the reading-in to determine properties of the sensing magnetic field.

14. A non-transitory computer readable medium having a computer program, which is executable by a processor, comprising:
a program code arrangement having program code for operating a sensor device for a vehicle, by performing the following:
reading in sensor signals from at least two magnetic field sensors of the sensor device, wherein the sensor device includes:
the at least two magnetic field sensors for detecting a sensing magnetic field from a sensing magnet;
wherein the at least two magnetic field sensors are configured so that a resultant magnetic field from the sensing magnetic field and an interference magnetic field from an interference source develops a different strength of effect in different ones of the at least two magnetic field sensors, and
wherein at least one of the magnetic field sensors includes a shielding device for shielding at least one component of the sensing magnetic field and/or the interference magnetic field, and/or wherein at least one of the magnetic field sensors includes a concentrating device for concentrating at least one component of the sensing magnetic field and/or the interference magnetic field, and
wherein the shielding device and/or the concentrating device is arranged within a housing of the sensor device, and
wherein the sensor device is configured to detect a size of a deviation between the sensing magnetic field and the magnetic interference field so that a comparator threshold is not exceeded; and
evaluating the sensor signals read in during the reading-in to determine properties of the sensing magnetic field.

15. The computer readable medium of claim 14, wherein at least one of the magnetic field sensors includes the shielding device for shielding at least one component of the sensing magnetic field and/or the magnetic interference field and/or at least one of the magnetic field sensors includes the concentrating device for concentrating at least one component of the sensing magnetic field and/or the interference magnetic field.

16. The sensor device of claim 1, wherein the vehicle is a utility vehicle and the at least two magnetic field sensors are configured for measuring a position of a sensing magnet when a magnetic interference field of up to 50 millitesla is present.

17. The sensor device of claim 1, wherein the vehicle is a utility vehicle and the at least two magnetic field sensors are configured for measuring a position of a sensing magnet when a magnetic interference field of up to 25 millitesla is present.

18. The sensor device of claim 1, wherein the at least one of the magnetic field sensors includes the shielding device, and the at least one of the magnetic field sensors includes the concentrating device.

19. The sensor device of claim 1, wherein the at least one of the magnetic field sensors includes the shielding device.

20. The sensor device of claim 1, wherein the at least one of the magnetic field sensors includes the concentrating device.

21. The sensor device of claim 1, wherein the sensor device is configured to detect the size of a deviation between the sensing magnetic field and the magnetic interference field so that a comparator threshold is not exceeded.

* * * * *